(12) United States Patent
McCorkle

(10) Patent No.: US 7,292,827 B2
(45) Date of Patent: Nov. 6, 2007

(54) SYSTEM AND METHOD FOR PROVIDING A SINGLE-ENDED RECEIVE PORTION AND A DIFFERENTIAL TRANSMIT PORTION IN A WIRELESS TRANSCEIVER

(75) Inventor: John W. McCorkle, Vienna, VA (US)

(73) Assignee: Freescale Semiconductor, Inc., Austin, TX (US)

(*) Notice: Subject to any disclaimer, the term of this patent is extended or adjusted under 35 U.S.C. 154(b) by 564 days.

(21) Appl. No.: 10/975,375

(22) Filed: Oct. 29, 2004

(65) Prior Publication Data

US 2006/0094357 A1    May 4, 2006

(51) Int. Cl.
*H04B 1/44* (2006.01)

(52) U.S. Cl. .............................. 455/78; 455/73; 455/79; 455/82; 455/83

(58) Field of Classification Search ................... 455/73, 455/78, 79, 82, 83, 127.2, 232.1
See application file for complete search history.

(56) References Cited

U.S. PATENT DOCUMENTS

2004/0124944 A1* 7/2004 Nation ....................... 333/104
2004/0232982 A1* 11/2004 Ichitsubo et al. ........... 330/129
2004/0253939 A1* 12/2004 Castaneda et al. ......... 455/341
2005/0215205 A1* 9/2005 Rofougaran ................. 455/78

* cited by examiner

*Primary Examiner*—Matthew Anderson
*Assistant Examiner*—Tuan Pham

(57) ABSTRACT

In an input/output circuit (200), a differential balun (250) is provided that has first and second balun inputs and first and second balun outputs. An antenna (230) is connected to the first and second balun outputs. A differential amplifier (220) has one output connected to the first balun input, and a second output connected to the second balun input, while a single-ended amplifier (110) has its input connected to the first balun input. A grounding switch (240) is connected between the second balun input and ground. During a transmit mode the grounding switch (240) is open, the differential amplifier (220) is turned on, and the single-ended amplifier (110) is turned off. During a receive mode the grounding switch (240) is closed, the differential amplifier (220) is turned off, and the single-ended amplifier (110) is turned on.

22 Claims, 4 Drawing Sheets

SYSTEM AND METHOD FOR PROVIDING A SINGLE-ENDED RECEIVE PORTION AND A DIFFERENTIAL TRANSMIT PORTION IN A WIRELESS TRANSCEIVER

FIELD OF THE INVENTION

The present invention relates in general to wireless communication systems, such as ultrawide bandwidth (UWB) systems, including mobile transceivers, centralized transceivers, related equipment, and corresponding methods. Another aspect of the present invention relates to a wireless transceiver that can provide high speed signals, but minimize any spectral lines in the resulting signal spectrum. Another aspect of the present invention relates to a method and circuit for eliminating undesirable harmonics in a transmitted signal.

BACKGROUND OF THE INVENTION

Ultrawide bandwidth (UWB) signals allow large amounts of data to be sent very rapidly at very low power. The UWB signals have their energy spread over a very large frequency band, which significantly reduces the interference on any particular lesser frequency bandwidth.

In order for a UWB transceiver to function, it must generate very wide bandwidth signals at a very high frequency. In one proposed implementation of a UWB transceiver, signals up to nearly 10 GHz must be generated. However, many ways of generating appropriate UWB signals at such high frequencies introduce undesirable harmonics into the signals, which in turn can cause spikes (often referred to as spectral lines) in the power spectral density of the transmitted signal. This can cause problems in the operation of UWB devices since under current FCC regulations the transmit power for UWB devices is limited according to the power spectral density (PSD) of the transmitted signal.

The FCC will not allow any portion of the power spectral density of a UWB signal to rise above the limits it imposes. As a result, if a UWB signal includes a spike in its power spectral density, the total transmission power of the UWB signal must be reduced until that spike falls below the FCC's power limits. This scenario can significantly reduce the total signal power of the transmitted signal. Thus, any spectral lines (i.e., spikes in the power spectral density) in a signal transmitted by a UWB device can reduce the effectiveness of that device. It is therefore very important that the power spectral density of the signal output by a transceiver be strictly controlled, and be as smooth and flat as possible.

Accordingly, it would be desirable to reduce the magnitude of any spikes in the power spectral density of any UWB signal generated by a UWB transceiver, since even order distortion will create spectral lines at harmonics of the chip rate (i.e., at the chipping frequency) when using BPSK and QPSK signalling. This reduction can be achieved by generating and using balanced (i.e., differential) signals.

It is also generally desirable to minimize the size and weight of a UWB device. This is true whether the device is portable or is intended to remain stationary. One generally accepted way to reduce the size of a transceiver is to share a single antenna with both a transmitter portion of a transceiver and a receiver portion of a transceiver, eliminating the need for repeating the antenna circuitry for the transmitter and receiver.

In a conventional embodiment that shares an antenna, a transmit/receive (T/R) switch is often used to switch the connections of a single antenna between a transmit circuit and a receive circuit. Thus, during a transmit operation the receive circuit will be isolated from the antenna by the T/R switch, and during a receive operation the transmit circuit will be isolated from the antenna by the T/R switch.

However, although this does generally reduce the overall circuitry in the device, this conventional design requires the inclusion of a T/R switch, which itself adds to the size and complexity of the device.

It would therefore be desirable to provide a wireless transceiver that eliminates the use of a T/R switch, but also minimizes the presence of spectral lines in any resulting transmission.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

One way to reduce the size of a wireless transceiver having a single antenna is to eliminate a transmit/receive (T/R) switch that selectively connects the antenna to a transmit circuit or a receive circuit, and instead employ a T/R signal that selectively turns on and off the transmit and receive circuits (or at least the portions of those circuits that connect to the antenna).

Figure 1:
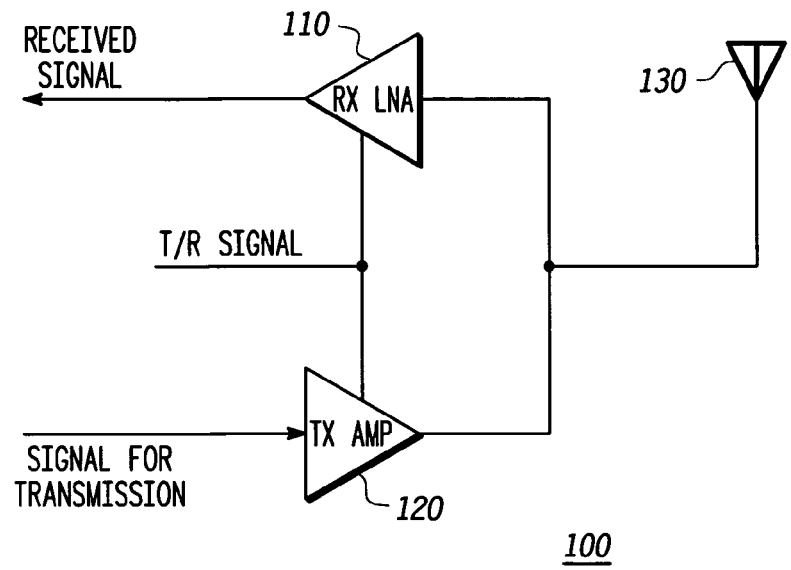
FIG. 1 is block diagram of an input/output circuit of a transceiver, according to a first disclosed embodiment of the present invention.

FIG. 1 is block diagram of an input/output circuit of a transceiver according to a first disclosed embodiment. As shown in FIG. 1, the input/output circuit 100 includes a receiver low noise amplifier (LNA) 110, a transmitter amplifier 120, and an antenna 130.

The receiver LNA 110 is connected to the antenna 130 and operates to amplify any signals received by the antenna 130 to produce a received signal that can be processed by the transceiver. The transmitter amplifier 120 receives a signal for transmission, amplifies it, and provides it to the antenna 130.

The receiver LNA 110 and the transmitter amplifier 120 are controlled by a T/R signal, which indicates whether the transceiver is in a transmit mode or a receive mode. When the T/R signal has a first value (e.g., a high voltage) it indicates a transmit mode; and when the T/R signal has a second value (e.g., a low voltage) it indicates a receive mode. The particular parameters of the first and second values can vary by embodiment. For example, in one embodiment the first value could be a high voltage and the second value could be a low voltage. But in another embodiment, the first value could be a low voltage and the second value could be a high voltage.

The antenna 130 receives and transmits wireless signals in a manner that would be understood by one skilled in the art of antennas. In the embodiment shown in FIG. 1, a UWB antenna may be used, such as the one disclosed in U.S. Pat. No. 6,590,545 to McCorkle, entitled "ELECTRICALLY SMALL PLANAR UWB ANTENNA APPARATUS AND SYSTEM THEREOF." However, alternate embodiments can use different antenna designs.

In operation, the transceiver input/output portion 100 operates as follows. During a transmit mode, the T/R signal has a first value, which is provided to both the receiver LNA 110 and the transmitter amplifier 120. This first value causes the receiver LNA 110 to be shut off and isolated from the antenna 130 (i.e., take on a high impedance state) and causes the transmitter amplifier 120 to be operational.

During a receive mode, the T/R signal has a second value, which is provided to both the receiver LNA 110 and the transmitter amplifier 120. This second value causes the receiver LNA 110 to be operational, and causes the transmitter amplifier 120 to be shut off and isolated from the antenna 130 (i.e., take on a high impedance state).

As a result of the use of a T/R signal to directly control the operation and impedances of the transmit and receive amplifiers 110 and 120, the input/output circuit 100 can selectively connect the transmit circuit or receive circuit of the transceiver to the antenna 130 without the use of a T/R switch.

Some embodiments, however, may employ different types of amplifiers for the transmitter and receiver circuits. For example, in some embodiments single-ended amplifiers are used, while in others differential amplifiers are used. In particular, it would be desirable in some embodiments for the receiver amplifier 110 and the transmitter amplifier 120 to be of different types, i.e., have one be a differential amplifier and the other be a single-ended amplifier. In one specific embodiment, a differential amplifier is used as the transmitter amplifier to help reduce spectral lines, while a single ended amplifier is used as the receiver amplifier. This has the beneficial effect of reducing power consumption.

However, if the transmitter and receiver amplifiers are of differing types, they cannot be both connected directly to the same antenna, as shown in FIG. 1. Without additional circuitry, the differential and single-ended inputs/outputs will not be able to properly connect to a single kind of antenna. One solution to this problem is to place a differential balun between the antenna and both a transmitter amplifier and a receiver amplifier. If one of the amplifiers is a single-ended amplifier, its output will be connected to a first node of the differential balun. If one of the amplifiers is a differential amplifier, its outputs will be connected to first and second nodes of the differential balun. A switch can then be connected between the second node of the differential balun and ground, the switch being closed whenever a single-ended amplifier is active and open when a differential amplifier is active. This process can be extended if more than two amplifiers must be connected to the antenna.

Figure 2:
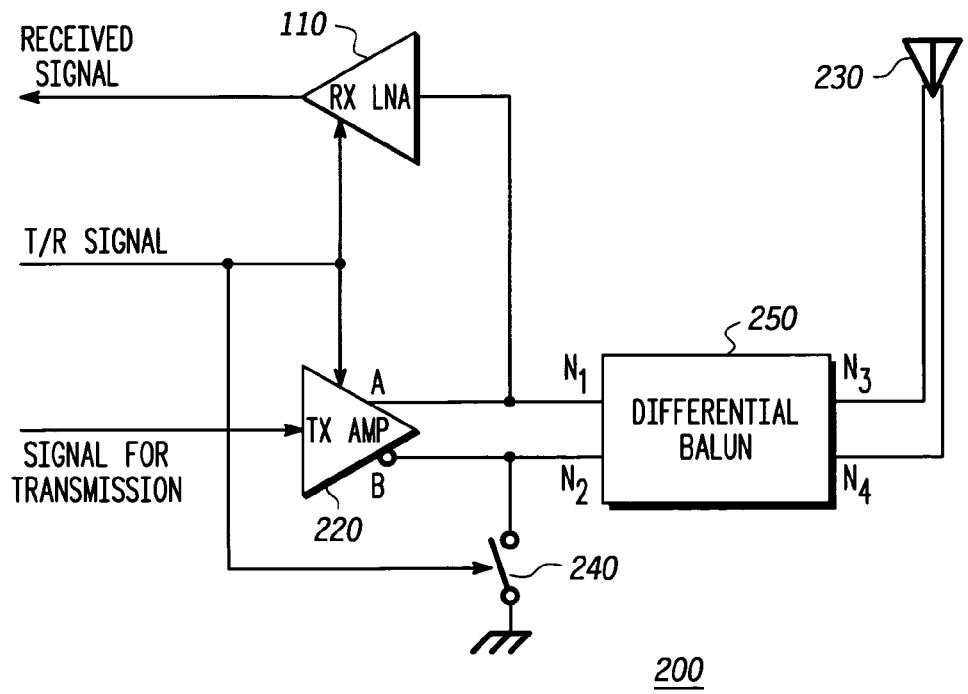
FIG. 2 is block diagram of an input/output circuit of a transceiver, according to a second disclosed embodiment of the present invention.

FIG. 2 is block diagram of an input/output circuit of a transceiver according to a second disclosed embodiment. As shown in FIG. 2, the input/output circuit 200 includes a single-ended receiver low noise amplifier (LNA) 110, a differential transmitter amplifier 220, an antenna 230, a switch 240, and a differential balun 250.

The single-ended receiver LNA 110 is connected to a first node $N_1$ of the differential balun 250 and operates to amplify any signals received by the antenna 230 to produce a received signal that can be processed by the transceiver. Regardless of the type of antenna 230 used (single-ended or differential), the single-ended receiver LNA 110 needs to have a single-ended signal as an input signal.

The differential transmitter amplifier 220 receives a signal for transmission, amplifies it, and provides it as a differential signal to the first and second nodes $N_1$ and $N_2$ of the differential balun 250. Regardless of the type of antenna 230 used (balanced or unbalanced), the differential transmitter amplifier 220 needs to have a differential signal as an output signal.

Figure 3:
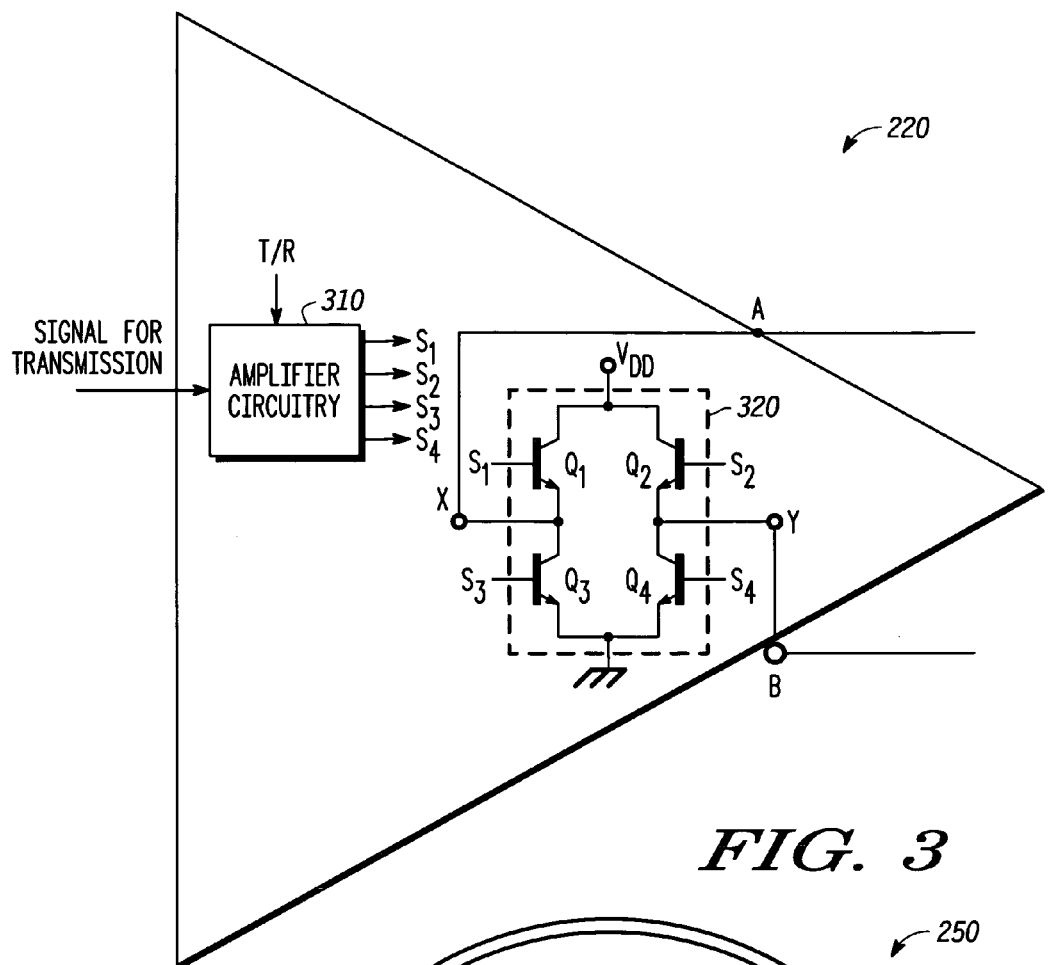
FIG. 3 is a circuit diagram of the output stage of the transmitter amplifier of FIG. 2, according to a disclosed embodiment of the present invention.

The differential transmitter amplifier 220 includes a balanced output stage for creating its differential output signal. FIG. 3 is a circuit diagram of the output stage of the differential transmitter amplifier of FIG. 2, according to a disclosed embodiment of the present invention.

As shown in FIG. 3, the differential transmitter amplifier 220 includes some amplifier circuitry 310 and a balanced output stage 320. The amplifier circuitry 310 receives a signal for transmission to be amplified and, based on both the transmission signal and a transmit/receive (T/R) control signal, generates first through fourth control signals $S_1$, $S_2$, $S_3$, and $S_4$. The balanced output stage 320 receives the first through fourth control signals $S_1$, $S_2$, $S_3$, and $S_4$ and produces two identical output signals at the first and second output nodes X and Y.

In the embodiment disclosed in FIG. 3, the balanced output stage 320 is an H-bridge having first through fourth transistors $Q_1$, $Q_2$, $Q_3$, and $Q_4$. However, in alternate embodiments, the balanced output stage 320 could include only the first and second transistors $Q_1$ and $Q_2$; could include only the third and fourth transistors $Q_3$ and $Q_4$; could have the first and second transistors $Q_1$ and $Q_2$ replaced with a center tapped inductor; could have the third and fourth transistors $Q_3$ and $Q_4$ replaced with a center tapped inductor; or could be replaced with any desirable balanced output stage circuitry.

Although the first through fourth transistors $Q_1$, $Q_2$, $Q_3$, and $Q_4$ are shown as bipolar transistors, they can also be implemented in other types of transistors, e.g., MOSFET or JFET.

In operation, the differential transmitter amplifier 220 provides a first output signal A and a second output signal B. In this embodiment the first output signal A is a non-inverted version of an amplified signal generated at the first output node X of the balanced output stage 320, and the second output signal B is an inverted version of an amplified signal generated at the second output node Y of the balanced output stage 320.

The first through fourth transistors $Q_1$, $Q_2$, $Q_3$, and $Q_4$, in the balanced output stage are controlled by first through fourth input signals $S_1$, $S_2$, $S_3$, and $S_4$ such that either the first and fourth transistors $Q_1$ and $Q_4$ are on and the second and third transistors $Q_2$ and $Q_3$ are off, or such that the first and fourth transistors $Q_1$ and $Q_4$ are off and the second and third transistors $Q_2$ and $Q_3$ are on. These two alternatives provide for either a first current path or a second current path. The first current path passes from $V_{DD}$ through the fist transistor $Q_1$, a load connected between nodes X and Y, the fourth transistor $Q_4$, and ground. The second current path passes from $V_{DD}$ through the second transistor $Q_2$, a load connected between nodes X and Y, the third transistor $Q_3$, and ground.

In addition, if the implementation of FIG. 3 is used for the output stage of the differential transmitter amplifier 220, then the fourth transistor $Q_4$ can be used as the switch 240. All that is required is to alter the differential transmitter amplifier 220 such that the fourth input signal $S_4$ supplied to the fourth transistor $Q_4$ is also controlled to make the transistor operational when the T/R signal indicates a receive mode. In an embodiment in which the first transmitter amplifier output A is connected to the switch 240, the third transistor $Q_3$ can be used as the switch. In this case, the third input signal $S_3$ supplied to the third transistor $Q_3$ is also controlled to make the transistor operational when the T/R signal indicates a receive mode.

Although FIG. 3 discloses that the first output signal A is non-inverted and the second output signal B is inverted, this could be reversed in alternate embodiments. In this case the first output signal A would be inverted and the second output signal B would remain non-inverted.

The single-ended receiver LNA 110 and the differential transmitter amplifier 220 are controlled by a T/R signal, which indicates whether the transceiver is in a transmit mode or a receive mode. When the T/R signal has a first value (e.g., a high voltage) it indicates a transmit mode; and when the T/R signal has a second value (e.g., a low voltage) it indicates a receive mode. The particular parameters of the first and second values can vary by embodiment. For example, in one embodiment the first value could be a high voltage and the second value could be a low voltage. But in another embodiment, the first value could be a low voltage and the second value could be a high voltage.

The switch 240 is connected between a second node $N_2$ of the differential balun 250 and ground, and is also controlled by the T/R signal. The switch 240 is closed when the single-ended receiver amplifier 110 is active, and is open when the differential transmitter amplifier 220 is active.

The differential balun 250 is connected between the antenna 230 and both the single-ended receiver LNA 110 and the differential transmitter amplifier 220. In the disclosed embodiment the differential balun 250 operates as a one-to-one balun to pass signals from one side to the other. In the disclosed embodiment, the differential balun 250 has first and second nodes $N_1$ and $N_2$ on one side and third and fourth nodes $N_3$ and $N_4$ on the other side. It serves as a transmission line for a differential signal connected across the first and second nodes $N_1$ and $N_2$ at one end of the transmission line and the third and fourth nodes $N_3$ and $N_4$ at the other end of the transmission line.

The first node $N_1$ has a direct current (DC) connection to the third node $N_3$, but their radio frequency (RF) voltages are isolated from each other by the common mode inductance of the balun 250. Similarly the second node $N_2$ is DC connected to the fourth node $N_4$, but their RF voltages are isolated from each other by the balun 250.

Figure 4:
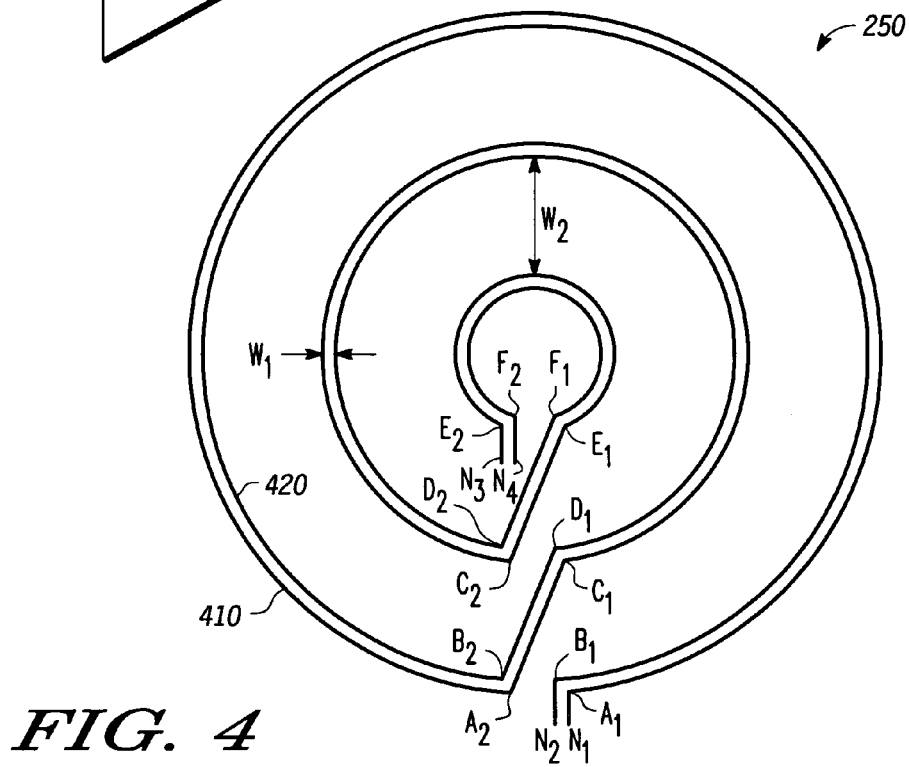
FIG. 4 is a circuit diagram of the differential balun of FIG. 2 using a spiral winding, according to a disclosed embodiment of the present invention.
Figure 5:
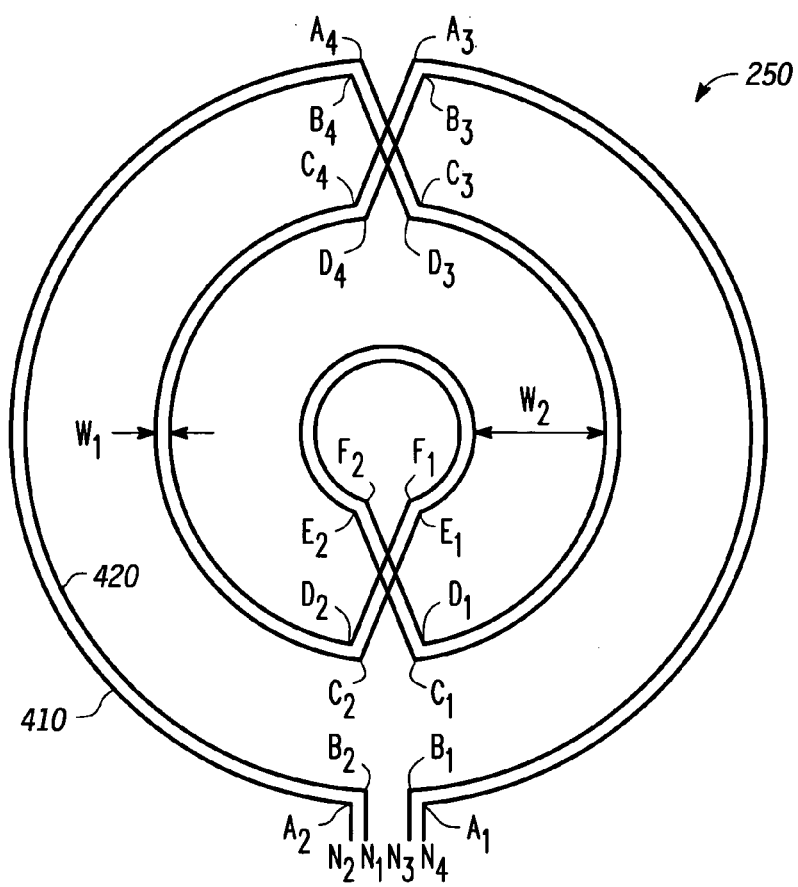
FIG. 5 is a circuit diagram of the differential balun of FIG. 2 using a balanced winding, according to a disclosed embodiment of the present invention.

FIG. 4 is a circuit diagram of the differential balun of FIG. 2 using a spiral winding, according to a disclosed embodiment of the present invention. FIG. 5 is a circuit diagram of the differential balun of FIG. 2 using a balanced winding, according to a disclosed embodiment of the present invention. As shown in both FIGS. 4 and 5, the balun 250 is formed from a first line 410 and a second line 420 wound together in a coiled pair. The first line 410 passes from the first node $N_1$ to the third node $N_3$, and the second line 420 passes from the second node $N_2$ to the fourth node $N_4$. The two lines 410 and 420 are separated from each other by a first distance $W_1$, while adjacent coils of the pair of lines are separated by a second distance $W_2$.

The first distance $W_1$ between the two coiled lines 410 and 420 is chosen based on the width of the two lines 410 and 420 to make the two lines operate at a desired impedance (e.g., as a 50 ohm transmission line). The second distance $W_2$ between adjacent coils in the balun 250 is chosen such that the capacitive impedance between adjacent coils is much higher than the capacitive impedance between adjacent wires (e.g., 10 to 20 times higher). As a result, adjacent windings of the balun 250 are effectively decoupled from each other, i.e., the balun 250 has low capacitive coupling between windings, but relies entirely on inductive coupling.

As shown in FIG. 4, one way of creating a balun is using spiral winding. In one spiral winding implementation two wires 410 and 420) are wrapped around a center to form multiple windings. The wires in each pair are separated by the first distance $W_1$, while adjacent wire circle pairs are separated by the second distance $W_2$. First ends of the wires ($N_1$ and $N_2$) form one end of the balun 250, while second ends of the wires ($N_3$ and $N_4$) form the other end of the balun 250.

In another spiral winding implementation multiple concentric wire circle pairs are formed, e.g., on a circuit board or etched into an integrated circuit. As with the first spiral winding implementation, the wires in each pair are separated by the first distance $W_1$, while adjacent wire circle pairs are separated by the second distance $W_2$. Then a portion of each circle pair is broken off (e.g., between points $A_1$ and $A_2$, $B_1$ and $B_2$, $C_1$ and $C_2$, $D_1$ and $D_2$, $E_1$ and $E_2$, and $F_1$ and $F_2$) and one end of each broken circle is connected to a broken end in the next larger adjacent circle pair, while the other end of the broken circles is connected a broken end in the next smaller adjacent circle pair. For example, node $A_2$ is connected to node $C_1$, node $B_2$ is connected to node $D_1$, node $C_2$ is connected to node $E_1$, and node $D_2$ is connected to node $F_1$. The unattached nodes ($A_1$ and $B_1$) at the outermost circle form one set of input/output nodes for the balun 250 (i.e., the first and second nodes $N_1$ and $N_2$), while the unattached nodes at the outermost circle ($E_2$ and $F_2$) form the other set of input/output nodes for the balun 250 (i.e., the third and fourth nodes $N_3$ and $N_4$).

As shown in FIG. 5, another way of creating a balun is using a balanced winding implementation. In this implementation, two wires are formed in multiple concentric wire circle pairs, e.g., on a circuit board or etched into an integrated circuit. As with the spiral winding implementations, the wires in each pair are separated by the first distance $W_1$, while adjacent wire circle pairs are separated by the second distance $W_2$. Then two portions of each circle pair are broken off, except for the innermost circle pair which only has one portion broken off. In FIG. 5 these portions are removed between points $A_1$ and $A_2$, $A_3$ and $A_4$, $B_1$ and $B_2$, $B_3$ and $B_4$, $C_1$ and $C_2$, $C_3$ and $C_4$, $D_1$ and $D_2$, $D_3$ and $D_4$, $E_1$ and $E_2$, $E_3$ and E, and $F_1$ and $F_2$.

For the innermost circle, each of the broken wire ends is connected to a corresponding broken end in the next larger adjacent circle pair (e.g., node $E_1$ is connected to node $C_2$, node $E_2$ is connected to node $C_1$, node $F_1$ is connected to node $D_2$, and node $F_2$ is connected to node $D_1$).

For the outermost circle, at one set of broken ends each broken wire end is connected to a corresponding broken end in the next smaller adjacent circle pair (e.g., node $A_3$ is connected to node $C_4$, node $A_4$ is connected to node $C_3$, node $B_3$ is connected to node $D_4$, and node $B_4$ is connected to node $D_3$). At the other set of broken ends each broken wire end ($A_1$, $A_2$, $B_1$, and $B_2$) serves as one of the input/output nodes ($N_1$, $N_2$, $N_3$, or $N_4$) for the balun 250.

For all of the remaining circles, at one set of broken ends each broken wire end is connected to a corresponding broken end in the next smaller adjacent circle pair (e.g., node $C_1$ is connected to node $E_2$, node $C_2$ is connected to node $E_1$, node $D_1$ is connected to node $F_2$, and node $D_2$ is connected to node $F_1$), while at the other set of broken ends each broken wire end is connected to a corresponding broken end in the next larger adjacent circle pair (e.g., node $C_3$ is connected to node $E_4$, node $C_4$ is connected to node $E_3$, node $D_3$ is connected to node $F_4$, and node $D_4$ is connected to node $F_3$).

Regardless of how it is implemented, however, the differential balun 250 has a differential mode transmission impedance $Z_0$ (i.e., a characteristic impedance of the line) and a common mode impedance $Z(f)$. The transmission impedance $Z_0$ is a function of the placement of the transmission lines. The inductive impedance $Z(f)$ arises from the inductance between the various windings in the balun 250 and is a function of the frequency at which the balun is operated. In operation it is desirable that the inductive impedance $Z(f)$ of the balun 250 in an operational frequency range be greater than the transmission impedance $Z_0$ by a certain factor (typically four or more times higher).

Figure 6:
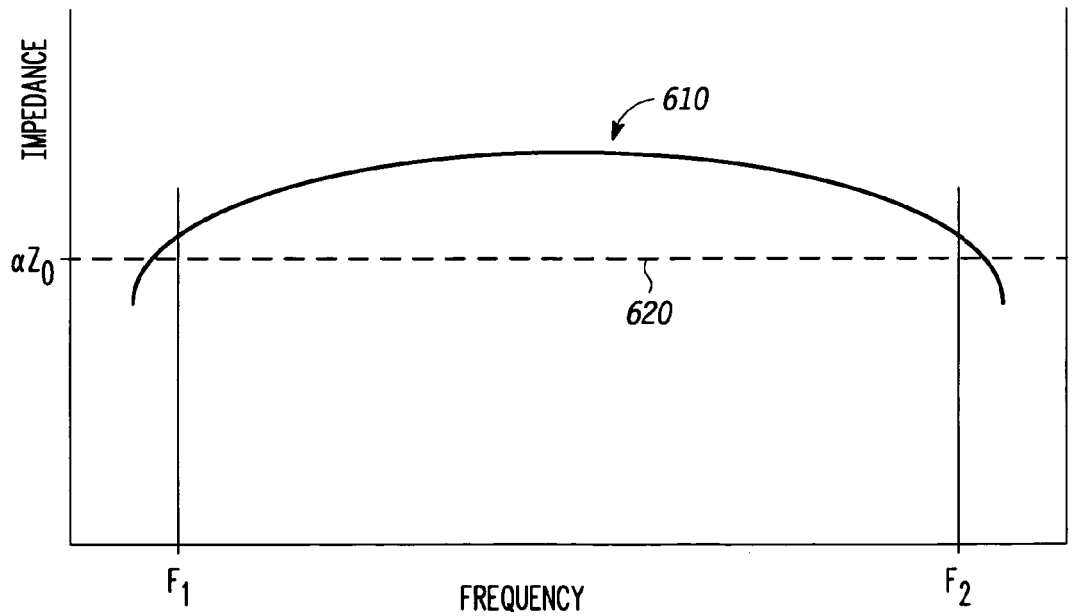
FIG. 6 is a graph of the inductive impedance of the differential balun of FIG. 2 versus operational frequency according to a disclosed embodiment of the present invention.

FIG. 6 is a graph of the common mode inductive impedance of the differential balun of FIG. 2 versus operational frequency according to a disclosed embodiment. As shown in FIG. 6, the inductive impedance $Z(f)$ 610 varies according to the operational frequency, but remains above a set threshold 620 during an operational frequency. The level of the threshold 620 is determined by multiplying the differential mode transmission line impedance $Z_0$ of the balun 250 by a multiplication factor $\alpha$. The operational frequency is bounded by a first frequency $F_1$ and a second frequency $F_2$.

In one disclosed embodiment the transmission impedance $Z_0$ of the balun 250 is 50 ohms, $\alpha>4$, $F_1$ is 3 GHz, and $F_2$ is 5 GHz.

The antenna 230 receives and transmits wireless signals in a manner that would be understood by one skilled in the art of antennas. In the embodiment shown in FIG. 1, a UWB antenna may be used, such as the one disclosed in U.S. Pat. No. 6,590,545 to McCorkle, entitled "Electrically Small Planar UWB Antenna Apparatus and System Thereof." However, alternate embodiments can use different antenna designs.

Figure 7:
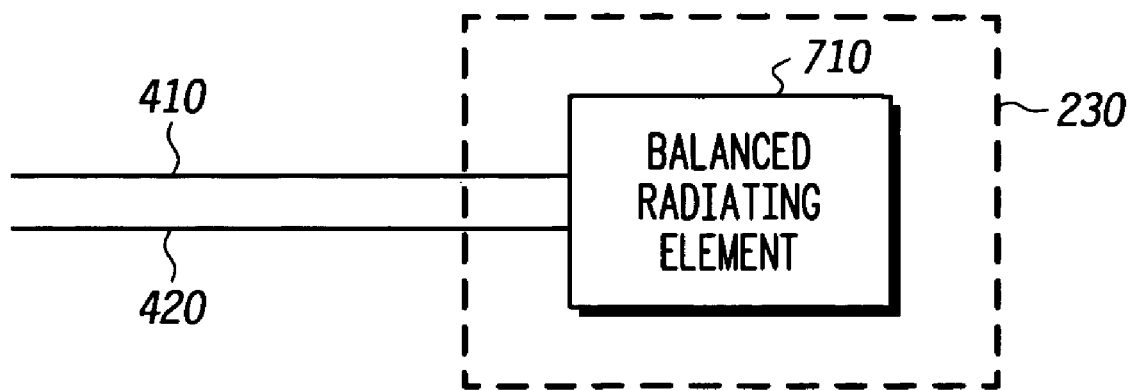
FIG. 7 is a block diagram of the antenna of FIG. 2 implemented using a balanced antenna, according to a disclosed embodiment of the present invention.
Figure 8:
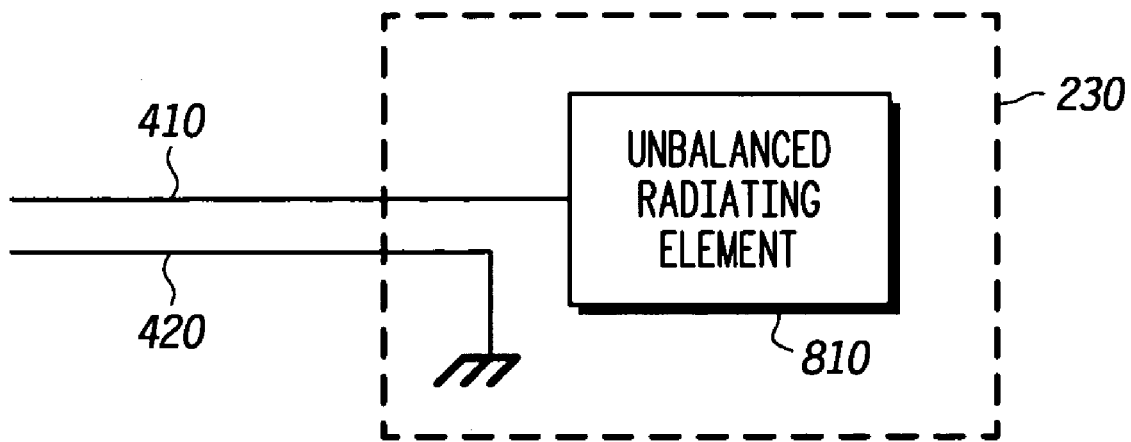
FIG. 8 is a block diagram of the antenna of FIG. 2 implemented using an unbalanced (i.e., single-ended) antenna, according to a disclosed embodiment of the present invention.

Because of the presence of the balun 250, the antenna 230 can be either a single-ended antenna (e.g., a monopole antenna) or a differential antenna (e.g., a dipole antenna). FIG. 7 is a block diagram of the antenna of FIG. 2 implemented as a balanced antenna, like a dipole, according to one embodiment of the present invention. FIG. 8 is a block diagram of the antenna of FIG. 2 implemented as an unbalanced (i.e., single-ended) antenna, like a monopole over a ground plane, according to one embodiment of the present invention.

As shown in FIG. 7, the balanced antenna is connected to the first and second signal lines 410 and 420 from the differential balun 250 (i.e., through nodes $N_3$ and $N_4$). Both The first line 410 and the second line are connected to a balanced radiating element 710. This radiating element can be a dipole antenna or the like.

In operation, the balanced radiating element 710 has two ends that are driven to opposite voltages. In a transmit mode the first and second lines 410 and 420 drive the two ends of the balanced radiating element 710 to produce a signal for transmission. In a receive mode, the two ends of the balanced radiating element 710 receive radio energy at opposite voltages and use these voltages to drive the first and second lines 410 and 420, respectively.

As shown in FIG. 8, the unbalanced antenna is connected to the first and second signal lines 410 and 420 from the differential balun 250. The first line 410 is connected to an unbalanced radiating element 810, and the second line 420 is connected to ground. In a transmit mode the voltage across the first and second lines 410 and 420 drives the unbalanced radiating element 810 to produce a signal for transmission. In a receive mode, the unbalanced radiating element 810 receives radio energy at a given voltage and sends that voltage to drive the first line 410.

Taken all together, the transceiver input/output portion 200 operates as follows. During a transmit mode, the T/R signal has a first value, which is provided to both the single-ended receiver LNA 110 and the differential transmitter amplifier 120, as well as to the switch 240. This first value causes: (a) the single-ended receiver LNA 110 to be shut off and isolated from the differential balun 250 (i.e., take on a high impedance state); (b) causes the differential transmitter amplifier 220 to be operational; and (c) causes the switch 240 to be put in the open position.

In this case, the differential transmit amplifier 220 has its differential output connected to the first and second nodes of the differential balun 250. The single-ended receiver LNA 110 is isolated from the differential balun 250 and the switch 240 is in the open position, so neither of these elements interferes with a transmit operation.

The balun 250 passes the differential voltage across its first and second nodes $N_1$ and $N_2$ to its third and fourth nodes $N_3$ and $N_4$, which drive the antenna 230. And because of the operation of the balun 250, this differential input voltage will drive the antenna 230 whether the antenna 230 is a differential antenna or a single-ended antenna.

If the antenna 230 is a differential antenna (as shown in FIG. 7), then the voltage difference across the differential outputs of the differential transmit amplifier 220 directly drives the first and second radiating elements 710 and 720 in the antenna 230.

If, however, the antenna 230 is a single-ended antenna (as shown in FIG. 8), then the first differential output of the differential transmit amplifier 220 drives the radiating element 810, while the second differential output of the differential transmit amplifier 220 is connected to the ground in the antenna 230. However, because the balun 250 serves to isolate its two ends such that their relative voltages are unimportant, the entire RF voltage between the first and second differential outputs of the differential transmit amplifier 220 will be provided as a voltage at the radiating element 810.

During a receive mode, the T/R signal has a second value, which is provided to both the single-ended receiver LNA 110 and the differential transmitter amplifier 220. This second value causes: (a) the single-ended receiver LNA 110 to be operational; (b) causes the differential transmitter amplifier 220 to be shut off and isolated from the differential balun 250 (i.e., take on a high impedance state); and (c) causes the switch 240 to be put in the closed position. In this case, the single-ended receiver LNA 110 has its input connected to a first node $N_1$ of the differential balun 250, the closed switch 240 connects the second node $N_2$ of the differential balun 250 to ground, and the differential transmitter amplifier 220 is isolated from the balun 250.

The antenna 230 receives a wireless signal and passes a voltage signal to the third and fourth nodes $N_3$ and $N_4$ of the balun 250, which then passes this voltage signal to its first and second nodes $N_1$ and $N_2$. But because of the operation of the balun 250 and the grounding of the second node $N_2$ by the switch 240, the voltage from the antenna 230 will be provided to the single-ended receiver LNA 110 as a single-ended input voltage whether the antenna 230 is a differential antenna or a single-ended antenna.

If the antenna 230 is a single-ended antenna (as shown in FIG. 7), then the voltage provided by the antenna 230 to the third node $N_3$ of the balun 250 (corresponding to the voltage at the radiating elements 810 of the antenna 230) win be a single-ended voltage, which is provided to the first node $N_1$ and thus the input of the single-ended receiver LNA 110 via the second line 420. The voltages at the second node $N_2$ and the fourth node $N_4$ will both be a ground voltage.

If, however, the antenna 230 is a differential antenna (as shown in FIG. 8), then the voltage difference between the third and fourth nodes $N_3$ and $N_4$ of the balun 250 (corresponding to the voltage difference between the first and second radiating elements 710 and 720 of the antenna 230) is provided at the input of the single-ended receiver LNA 110. In this case, the balun 250 serves to isolate the voltages at the first and second nodes $N_1$ and $N_2$ from the voltages at the third and fourth nodes $N_3$ and $N_4$ such that their relative voltages are unimportant. And because the second node N2 is grounded by the switch 240, this allows the differential voltage received at the antenna 230 and provided to the third and fourth nodes $N_3$ and $N_4$ to transform into a single-ended voltage at the first node $N_1$;

Therefore, as a result of the use of a T/R signal to directly control the operation and output impedances of the transmit and receive amplifiers 110 and 220, as well as the position of the switch 240, the input/output circuit 200 can selectively connect the transmit circuit or receive circuit of the transceiver to the differential balun 250 (and ultimately to the antenna 230) without the use of a T/R switch.

Furthermore, the input/output circuit 200 of FIG. 2 can connect transmitter amplifiers and receiver amplifiers to an antenna without any regard for whether all of the elements are of the same type (i.e., single-ended or differential). Any combination of devices can be accommodated without difficulty (e.g., a differential transmitter amplifier, a single-ended receiver LNA, and a single-ended antenna). The input/output circuit 200 can selectively operate in either a single-ended mode or a differential mode based on the value of the T/R signal. Both will properly receive or transmit (as needed) on either type of antenna 230.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An input/output circuit for a wireless transceiver, comprising:
   a differential balun having first and second differential balun inputs and first and second differential balun outputs;
   an antenna connected to the first and second differential balun outputs;
   a differential transmitter amplifier having a first transmitter output connected to the first differential balun input, and a second transmitter output connected to the second differential balun input;
   a single-ended receiver low noise amplifier having a receiver input connected to the first differential balun input; and
   a grounding switch connected between the second differential balun input and ground,
   wherein during a transmit mode the grounding switch is open, the differential transmitter amplifier is turned on, and the single-ended receiver low noise amplifier is turned off, and
   wherein during a receive mode the grounding switch is closed and the differential transmitter amplifier is turned off, and the single-ended receiver low noise amplifier is turned on.

2. An input/output circuit for a wireless transceiver, as recited in claim 1, wherein the antenna is unbalanced, the first differential balun output is connected to ground, and the second differential balun output is connected to a radiating surface of the antenna.

3. An input/output circuit for a wireless transceiver, as recited in claim 1, wherein the antenna is balanced, the first differential balun output is connected to a first radiating surface of the antenna, and the second differential balun output is connected to a second radiating surface of the antenna.

4. An input/output circuit for a wireless transceiver, as recited in claim 1, wherein the balun comprises first and second parallel signal lines formed in substantially concentric coils, the first parallel line being connected between the first differential balun input and the first differential balun output, and the second parallel line being connected between the second differential balun input and the second differential balun output.

5. An input/output circuit for a wireless transceiver, as recited in claim 4, wherein a first separation between adjacent coils of the substantially concentric coils is at least four times a second separation between the first and second parallel signal lines.

6. An input/output circuit for a wireless transceiver, as recited in claim 4, wherein a first impedance between the first and second parallel signal lines is at least 10 times lower than a second impedance between adjacent coils of the substantially concentric coils.

7. An input/output circuit for a wireless transceiver, as recited in claim 4, wherein the impedance of the balun satisfies a set criteria for an operational frequency range.

8. An input/output circuit for a wireless transceiver, as recited in claim 7, wherein the set criteria is to be above a set threshold impedance value.

9. An input/output circuit for a wireless transceiver, as recited in claim 1, wherein the first transmitter output is a non-inverting output and the second transmitter output is an inverting output.

10. An input/output circuit for a wireless transceiver, as recited in claim 1, wherein the second transmitter output is a non-inverting output and the first transmitter output is an inverting output.

11. An input/output circuit for a wireless transceiver, as recited in claim 1, wherein the switch is formed in the differential transmitter amplifier.

12. An input/output circuit for a wireless transceiver, as recited in claim 1, wherein the differential transmitter amplifier further comprises:
a first transistor connected between a source voltage and a first output node, the first transistor receiving a first control signal;
a second transistor connected between a source voltage and a second output node, the second transistor receiving a second control signal;
a third transistor connected between the first output node and ground, the third transistor receiving a third control signal; and
a fourth transistor connected between the second output node and ground, the fourth transistor receiving a fourth control signal,
wherein during a transmit mode the first through fourth control signals bias the first through fourth transistors, respectively, to a linear state, and
wherein during a receive mode the first through fourth control signals turn off the first through fourth transistors, respectively.

13. An input/output circuit for a wireless transceiver, as recited in claim 1, wherein the differential transmitter amplifier further comprises:
a first transistor connected between a source voltage and a first output node, the first transistor receiving a first control signal;
a second transistor connected between a source voltage and a second output node, the second transistor receiving a second control signal;
a third transistor connected between the first output node and ground, the third transistor receiving a third control signal; and
a fourth transistor connected between the second output node and ground, the fourth transistor receiving a fourth control signal,
wherein the fourth transistor forms the grounding switch,
wherein during a transmit mode the first through fourth control signals bias the first through fourth transistors, respectively, to a linear state,
wherein during a receive mode the first through third control signals turn off the first through third transistors, respectively, and
wherein during a receive mode the fourth control signals turns on the fourth transistor.

14. An input/output circuit for a wireless transceiver, as recited in claim 1, wherein the wireless transceiver is embodied in an integrated circuit.

15. An input/output circuit for a wireless transceiver, as recited in claim 1, wherein the wireless transceiver is an ultrawide bandwidth transceiver.

16. A method of receiving and transmitting wireless signals in a transceiver having a differential transmitter, the differential transmitter comprising a differential balun connected between a differential transmitter amplifier and an antenna, the method comprising:
connecting a single-ended receiver low noise amplifier to a first differential input of the differential balun;
connecting a second differential input of the differential balun to ground,
isolating the differential transmitter amplifier from the differential balun;
receiving a wireless signal at the antenna, and passing the signal through the differential balun to the receiver low noise amplifier;
isolating the second differential input of the differential balun to ground; connecting the differential transmitter amplifier from the differential balun; and
transmitting the wireless signal from the differential transmitter amplifier through the differential balun to the antenna.

17. A method of receiving wireless signals, as recited in claim 16, wherein the step of isolating the differential transmitter amplifier is performed by bringing its output nodes to a high impedance.

18. A method of receiving wireless signals, as recited in claim 16, wherein the step of connecting the second differential input of the differential balun to ground is performed through the use of a switch connected between the second differential input of the differential balun and ground.

19. A method of receiving wireless signals, as recited in claim 18, wherein the switch is a transistor switch.

20. A method of receiving wireless signals, as recited in claim 19, wherein the transistor switch is contained in the differential transistor amplifier.

21. A method of receiving wireless signals, as recited in claim 16, wherein the method is implemented in an integrated circuit.

22. A method of receiving wireless signals, as recited in claim 16, wherein the method is implemented in an ultrawide bandwidth transceiver.

* * * * *